United States Patent
Pan et al.

(10) Patent No.: US 9,780,046 B2
(45) Date of Patent: Oct. 3, 2017

(54) SEAL RINGS STRUCTURES IN SEMICONDUCTOR DEVICE INTERCONNECT LAYERS AND METHODS OF FORMING THE SAME

(71) Applicant: Taiwan Semiconductor Manufacturing Company, Ltd., Hsin-Chu (TW)

(72) Inventors: Hsin-Yu Pan, Taipei (TW); Han-Ping Pu, Tai-Chung (TW); Pei-Haw Tsao, Tai-Chung (TW); Yu-Chen Hsu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/940,920

(22) Filed: Nov. 13, 2015

(65) Prior Publication Data
US 2017/0141052 A1    May 18, 2017

(51) Int. Cl.
*H01L 21/02* (2006.01)
*H01L 23/58* (2006.01)
*H01L 23/31* (2006.01)
*H01L 23/00* (2006.01)
*H01L 21/56* (2006.01)

(52) U.S. Cl.
CPC .......... *H01L 23/585* (2013.01); *H01L 21/563* (2013.01); *H01L 23/3171* (2013.01); *H01L 23/564* (2013.01); *H01L 24/03* (2013.01); *H01L 24/09* (2013.01); *H01L 24/17* (2013.01); *H01L 2224/02373* (2013.01); *H01L 2224/06133* (2013.01)

(58) Field of Classification Search
CPC .......... H01L 29/92; H01L 27/02; H01L 49/02
USPC .......................... 438/479; 118/715; 257/532
See application file for complete search history.

(56) References Cited

U.S. PATENT DOCUMENTS

| | | | | |
|---|---|---|---|---|
| 6,166,423 | A * | 12/2000 | Gambino | .......... H01L 21/76807 257/532 |
| 6,940,114 | B2 * | 9/2005 | Oh | .................... H01L 21/76801 257/295 |
| 7,750,485 | B2 * | 7/2010 | Takahashi | ........... H01L 21/7685 257/306 |
| 7,838,424 | B2 | 11/2010 | Karta et al. | |
| 7,863,742 | B2 | 1/2011 | Yu et al. | |
| 7,932,601 | B2 | 4/2011 | Chang et al. | |
| 7,994,610 | B1 * | 8/2011 | Quinn | ................. H01L 23/5223 257/532 |
| 8,754,508 | B2 | 6/2014 | Chen et al. | |
| 8,772,151 | B2 | 7/2014 | Chen | |
| 8,846,548 | B2 | 9/2014 | Tu et al. | |
| 8,884,400 | B2 * | 11/2014 | Tsai | ........................ H01L 23/48 257/528 |

(Continued)

*Primary Examiner* — Caleb Henry
(74) *Attorney, Agent, or Firm* — Slater Matsil, LLP

(57) ABSTRACT

An embodiment device includes a semiconductor substrate and an interconnect structure over the semiconductor substrate. The interconnect structure includes a functional circuit region and a first portion of a seal ring spaced apart from the functional circuit region by a buffer zone. The device also includes a passivation layer over the interconnect structure and a second portion of the seal ring over the passivation layer and connected the first portion of the seal ring. The second portion of the seal ring is disposed in the buffer zone.

20 Claims, 9 Drawing Sheets

(56) References Cited

U.S. PATENT DOCUMENTS

| | | | |
|---|---|---|---|
| 8,890,223 B1* | 11/2014 | Bonifield | H01L 27/0288 |
| | | | 257/296 |
| 9,276,057 B2* | 3/2016 | Liao | H01L 28/75 |
| 9,299,697 B2* | 3/2016 | West | H01L 28/91 |
| 9,349,787 B1* | 5/2016 | Lee | H01L 28/60 |
| 2010/0127347 A1* | 5/2010 | Quinn | H01L 23/5223 |
| | | | 257/532 |
| 2012/0112314 A1* | 5/2012 | Jou | H01L 23/5223 |
| | | | 257/532 |
| 2012/0146124 A1* | 6/2012 | Hafez | G11C 16/0466 |
| | | | 257/321 |
| 2013/0341800 A1 | 12/2013 | Tu et al. | |
| 2014/0015122 A1 | 1/2014 | Chou et al. | |
| 2014/0045379 A1 | 2/2014 | Chen | |
| 2014/0048926 A1 | 2/2014 | Wang et al. | |
| 2014/0077356 A1 | 3/2014 | Chen et al. | |
| 2014/0145301 A1* | 5/2014 | Moghe | H01L 23/48 |
| | | | 257/532 |
| 2014/0183693 A1 | 7/2014 | Tsai et al. | |
| 2014/0187103 A1 | 7/2014 | Chen et al. | |
| 2014/0252558 A1 | 9/2014 | Yu et al. | |
| 2014/0252597 A1 | 9/2014 | Tsai et al. | |
| 2014/0252601 A1 | 9/2014 | Lu et al. | |
| 2014/0252608 A1 | 9/2014 | Chen et al. | |
| 2014/0262468 A1 | 9/2014 | Chen et al. | |
| 2014/0264885 A1 | 9/2014 | Tsai et al. | |
| 2015/0102461 A1* | 4/2015 | Lee | H01L 27/10814 |
| | | | 257/532 |
| 2015/0115407 A1* | 4/2015 | Tao | H01L 23/481 |
| | | | 257/532 |

* cited by examiner

SEAL RINGS STRUCTURES IN SEMICONDUCTOR DEVICE INTERCONNECT LAYERS AND METHODS OF FORMING THE SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

Generally, the semiconductor die may be connected to other devices external to the semiconductor die through a type of packaging utilizing solder bumps. The solder bumps may be formed by initially forming one or more redistribution layers (RDLs)/undercontact metallization on the semiconductor die and then placing solder onto the RDLs/undercontact metallization. After the solder has been placed, a reflow operation may be performed in order to shape the solder into the desired bump shape. The solder bump may then be placed into physical contact with the external device and another reflow operation may be performed in order to bond the solder bump with the external device. In such a fashion, a physical and electrical connection may be made between the semiconductor die and an external device, such as a printed circuit board, another semiconductor die, or the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
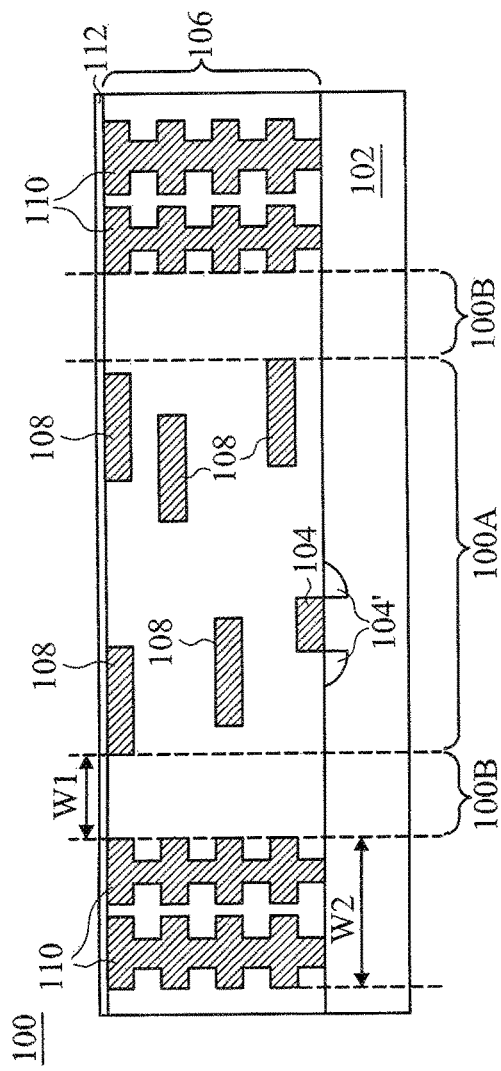
FIGS. 1A through 8 illustrate cross-sectional and top-down views of various intermediary stages of manufacturing a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are described with respect to a specific context, namely wafer level chip scale packaging (WLCSP). Other embodiments, however, may be applied to other types of packaging configurations.

Various embodiments include a semiconductor device package having a device die and a seal ring extending into the device die. The seal ring may encircle an internal functional circuit region of the device die having functional circuits formed therein. In various embodiments, a buffer zone (e.g., having no functional circuits or seal ring features) may be formed between the seal ring and the functional circuit region of the device die. The buffer zone may be employed in order to prevent (or at least reduce) damage to the internal circuit region of the device die caused by the seal ring during die processing. Passivation and/or polymer layers having redistribution lines (RDLs) may be formed over the die, and the seal ring may also extend into these passivation and polymer layers. In various embodiments, at least a portion of the seal ring disposed above the die may further extend laterally into the buffer zone. Throughout the description, the term "lateral" is used to describe a direction substantially parallel to a major surface of an underlying substrate and is not used to describe any absolute orientation. Edges of the polymer layers may be disposed over the seal ring (e.g., in the buffer zone), and thus, the seal ring may be used as a landing pad for the polymer layers, which advantageously mitigates stress in the resulting package during subsequent manufacturing processes and reduces manufacturing defects (e.g., delamination).

FIG. 1A illustrates a cross-sectional view of a device die 100 according to some embodiments. Die 100 may be a semiconductor die and could be any type of integrated circuit, such as a processor, logic circuitry, memory, analog circuit, digital circuit, mixed signal, and the like. Although referred to as a die throughout, some or all processing to die 100 may occur while die 100 is part of a larger wafer (not illustrated). A singulation process may be applied to separate die 100 from other features in the wafer (e.g., other device dies).

Die 100 may include a substrate 102, active devices 104, and an interconnect structure 106 over the substrate. Substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, substrate 102 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active devices 104 such as transistors, capacitors, resistors, diodes, photo-diodes, fuses, and the like may be formed at the top surface of substrate 102. Interconnect structure 106 may be formed over active devices 104 and substrate 102. Interconnect structure 106 may include inter-layer dielectric (ILD) and/or inter-metal dielectric (IMD) layers containing conductive features 108 (e.g., conductive lines and vias) formed using any suitable method. The ILD and IMD layers may include low-k dielectric materials having k values, for example, lower than about 4.0 or even 2.0 disposed between such conductive features. In some embodiments, the ILD and IMD layers may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD).

Conductive features 108 may be formed by a damascene process, such as single damascene or a dual damascene process. Conductive features 108 are formed of a conductive material (e.g., comprising copper, aluminum, tungsten, combinations thereof, and the like), and conductive features 108 may be lined with a diffusion barrier layer and/or an adhesion layer (not shown). The diffusion barrier layer may be formed of one or more layers of TaN, Ta, TiN, Ti, CoW, or the like. Conductive features 108 in interconnect structure 106 electrically connects various active devices 104 to form functional circuits within die 100. The functions provided by such circuits may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

It should also be noted that one or more etch stop layers (not shown) may be positioned between adjacent ones of the ILD and IMD layers. Generally, the etch stop layers provide a mechanism to stop an etching process when forming vias and/or contacts. The etch stop layers are formed of a dielectric material having a different etch selectivity from adjacent layers, e.g., the underlying substrate 102 and the overlying interconnect structure 106. In an embodiment, the etch stop layers may be formed of SiN, SiCN, SiCO, CN, combinations thereof, or the like, deposited by CVD or PECVD techniques.

Figure 1B:
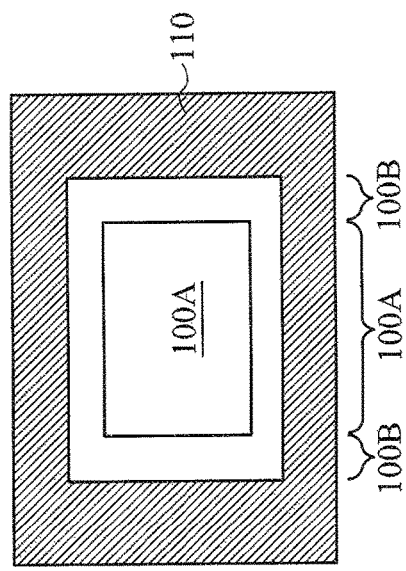

As further illustrated by FIG. 1A, interconnect structure 106 further includes one or more seal rings 110, which may also extend through the ILD and IMD layers adjacent conductive features 108. Seal rings 110 may provide protection for the features of die 100 (e.g., conductive features 108) from water, chemicals, residue, and/or contaminants that may be present during the processing of die 100. Each seal ring 110 may be formed along a periphery of die 100 and may be a continuous structure formed to surround a functional circuit region 100A of die 100 (e.g., the region of die 100 having conductive features 108 formed there) as illustrated in the top down view of die 100 provided in FIG. 1B. In FIG. 1B, a single seal ring 110 is illustrated although multiple seal rings may be included (e.g., see FIG. 1A). Furthermore, in FIG. 1B, seal ring 110 is substantially rectangular in shape although, in other embodiments, seal rings 110 may have a different shape in a top down view. Referring back to FIG. 1A, seal rings 110 may be formed of a conductive material. In an embodiment, seal rings 110 are formed by a same material, at a same time, and by a same process(es) as conductive features 108. For example, seal rings 110 may include conductive line portions in various ILD and IMD layers with conductive via portions connecting the conductive line portions between ILD and IMD layers.

In various embodiments, seal rings 110 may be electrically isolated from active devices 104, and seal rings 110 may not form any functional circuits with active devices 104. Furthermore, seal rings 110 may be spaced apart from functional circuit region 100A of die 100 by a buffer zone 100B (sometimes referred to as a seal ring extension zone (SREZ)). By including a buffer zone 100B of a suitable size, the risk of damage to conductive features 108 during the formation of seal ring 110 may be reduced. For example, in an embodiment, buffer zone 100B has a lateral dimension W1 of about 5.4 µm, for example, although buffer zone 100B may have a different dimension in other embodiments. In such embodiments, seal rings 110 may span a lateral dimension W2 of about 9 µm, for example, although seal rings 110 may occupy a different footprint in other embodiments. Furthermore, although FIG. 1A illustrates seal ring 110 as stopping at a top surface of substrate 102, in other embodiments, seal ring 110 may extend into substrate 102. In some embodiments, a bottom of seal ring 110 may be substantially level or lower than bottoms of active device regions (e.g., source/drain regions 104') in substrate 102.

A passivation layer 112 is formed over interconnect structure 106 (including conductive features 108 and seal rings 110), such as over a topmost metallization layer in interconnect structure 106. In some embodiments, passivation layer 112 may include a similar material as underlying ILD and IMD layers (e.g., a low-k dielectric). In other embodiments, passivation layer 112 may be formed of non-organic materials such as silicon oxide, un-doped silicate glass, silicon oxynitride, and the like. Other suitable passivation materials may also be used.

Figure 2:
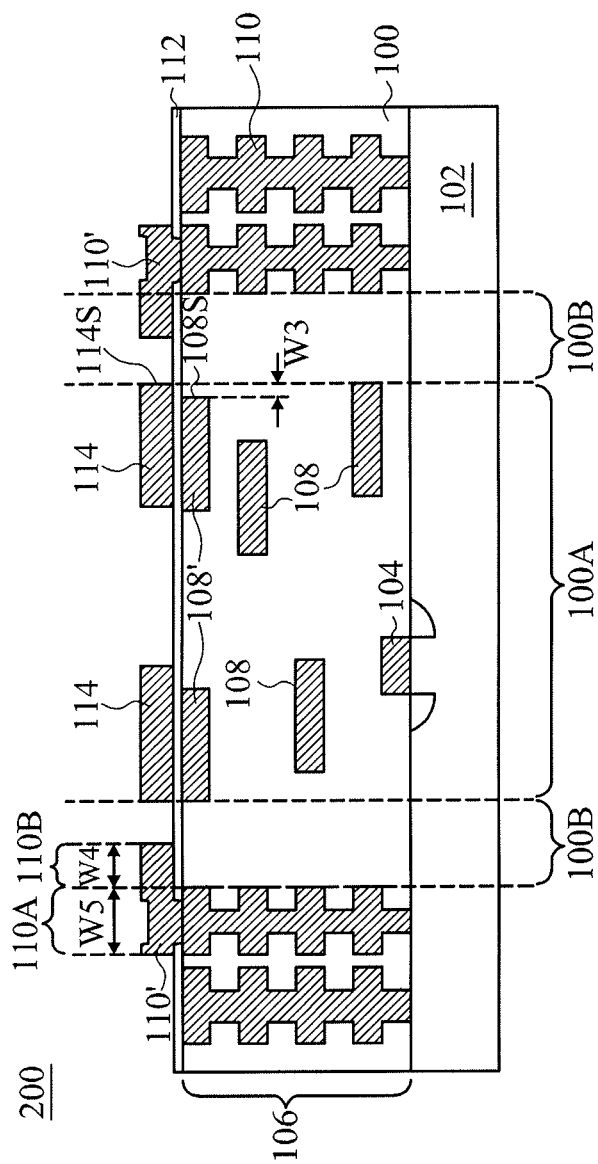

FIGS. 2 through 6 illustrate cross-sectional views of various intermediary stages of forming input/output features over die 100 to form a wafer-level chip scale package 200. In FIG. 2, various interconnect features are formed over passivation layer 112. For example, conductive features 114 may be formed over passivation layer 112. Conductive features 114 may be contact pads and/or RDLs depending on package design, and conductive features 114 may comprise a metallic material, such as aluminum, but other materials, such as copper, may alternatively be used.

In some embodiments, conductive features 114 may be formed using a deposition process, such as sputtering, to form a layer of material (not shown) and portions of the layer of material may then be removed through a suitable process (such as photolithographic masking and etching) to form conductive features 114. In another embodiment, the formation of conductive features 114 may include depositing a conductive seed layer (not shown), using a mask layer (not shown) having various openings to define the shape of conductive features 114, and filling the openings in the mask layer using an electro-chemical plating or electroless plating process, for example. The mask layer and excess portions of the seed layer may then be removed. Conductive features 114 may be electrically connected to conductive features 108 within die 100, and sidewalls of conductive features 114 may or may not be aligned with sidewalls of underlying conductive features 108 in top-most metallization layer of die 100 (labeled 108' in FIG. 2). For example, FIG. 2 illustrates a conductive feature 114 having sidewalls 114S misaligned with sidewalls 108S of a conductive feature 108 directly underlying the conductive feature 114. In some embodiments, a lateral distance W3 between sidewalls 114A and 108S may be about 1 µm, although distance W3 may be different in other embodiments.

As further illustrated by FIG. 2, seal ring portions 110' may also be formed over die 100. In a top down view of package 200 (not shown), seal ring portions 110' may encircle conductive features 114. In some embodiments, seal ring portions 110' may be formed of a same material, at a same time, and using the same process(es) as conductive features 114. Seal ring portions 110' may extend through passivation layer 112 to contact portions of seal ring 110 within die 100. Furthermore, seal ring portion 110' may include a portion 110A outside of buffer zone 100B and a portion 110B disposed within buffer zone 100B. In some embodiments portion 110A outside of buffer zone 110B has a lateral dimension W5, and portion 110B in buffer zone 100B has a lateral dimension W4. In various embodiments, lateral dimension W4 may be at least about 10% of lateral dimension W5, and lateral dimension W4 may be at least about 1 µm. For example, in an embodiment, lateral dimension W4 is about 3.24 µm. It has been observed that by extending a portion of seal ring 110 into buffer zone 100B to the above dimensions, stress to the resulting package due to subsequent processing may be absorbed by seal ring 110, which advantageously reduces manufacturing defects (e.g., delamination).

Figure 3:
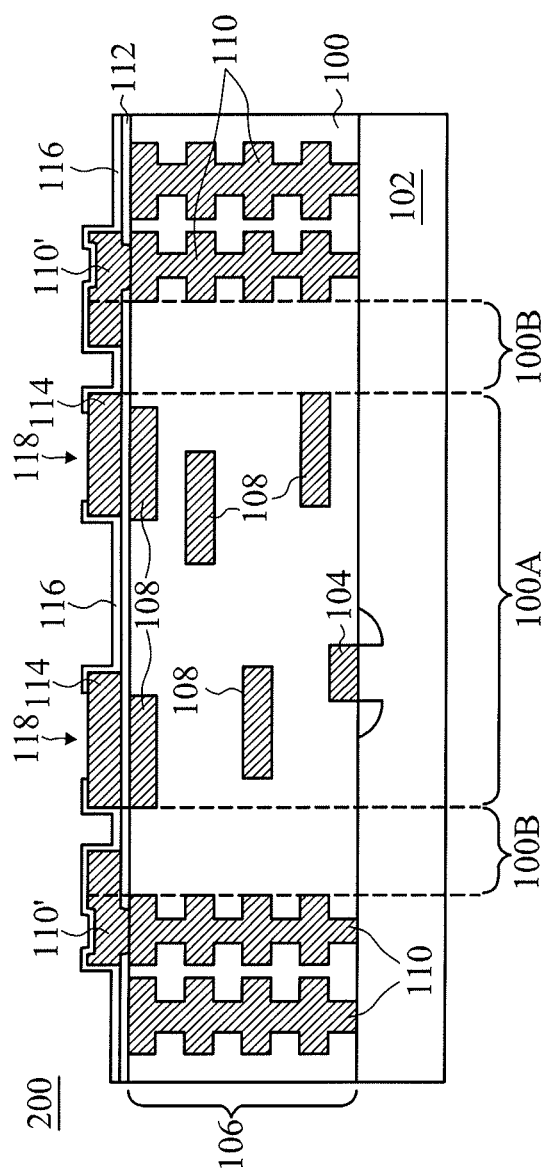

Next in FIG. 3, a passivation layer 116 is formed over conductive features 114, seal rings 110, and passivation layer 112. In various embodiments, passivation layer 116 may be formed using a similar material and/or similar processes as described above with regards to passivation layer 112. For example passivation layer 116 may comprise non-organic materials such as silicon oxide, un-doped silicate glass, silicon oxynitride, and the like. The material of passivation layer 116 and 112 may or may not be the same. In some embodiments, passivation layer 116 may be deposited using a conformal deposition process, and a thickness T1 of passivation layer 116 may be about 0.8 µm to about 1 µm. Passivation layer 116 may further be patterned (e.g., using photolithography and/or etching) to include openings 118, which expose at least portions of underlying conductive features 114. After patterning, portions of passivation layer 116 may still cover edge portions of conductive features 114.

Figure 4:
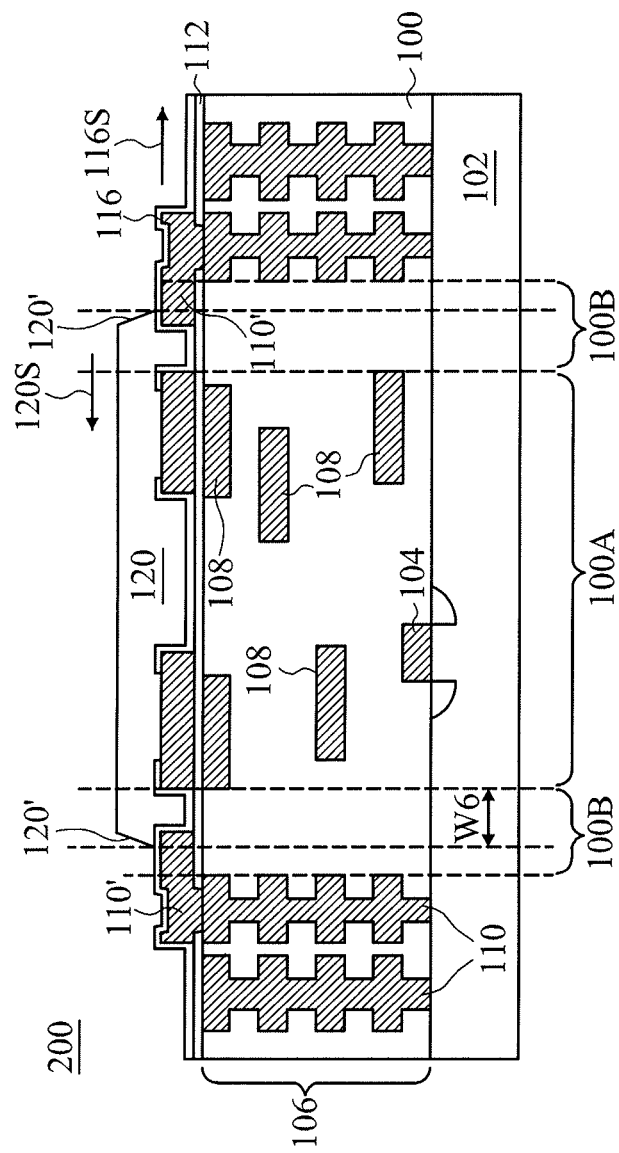

Referring next to FIG. 4, a polymer layer 120 is formed over passivation layer 116. Polymer layer 120 may be formed of any suitable material (e.g., polyimide (PI), polybenzoxazole (PBO), benzocyclobuten (BCB), epoxy, silicone, acrylates, nano-filled pheno resin, siloxane, a fluorinated polymer, polynorbornene, and the like) using any suitable method, such as, a spin-on coating technique, lamination, and the like. In some embodiments, polymer layer 120 is deposited to have a thickness T2 of about 4 µm to about 7 µm although thickness T2 may be different in other embodiments. In some embodiments, polymer layer 120 and passivation 116 may comprise different materials, which may apply stress to the die 100 in different directions (e.g., opposing directions). For example, polymer layer 120 may apply tensile stress in a direction towards an interior of die 100 (indicated by arrow 120S) whereas passivation layer 116 may apply compressive stress in a direction towards an exterior of die 100 (indicated by arrow 116S).

Polymer layer 120 may extend beyond edges of functional circuit region 100A into buffer zone 100B by a lateral dimension W6. For example, in an embodiment, lateral dimension W6 may be about 3.24 µm to about 5.86 µm. In various embodiments edges 120' of polymer layer 120 may be aligned directly over seal ring portions 110' in buffer zone 100B. By disposing endpoints (e.g., edges 120') of polymer layer 120 directly over seal ring portions 110', seal ring 110 may be used absorb stress applied to the package during subsequent manufacturing processes (e.g., the stress applied by polymer layer 120 and passivation layer 116 as indicated by arrows 120s and 116s). These subsequent manufacturing processes may include bonding other package components (e.g., surface mount technologies (SMTs), other dies, and the like) to package 200, curing processes (e.g., curing polymer layer 120), and the like. In such embodiments, the risk of manufacturing defects (e.g., delamination) as a result of these subsequent processes may be reduced.

Figure 5:
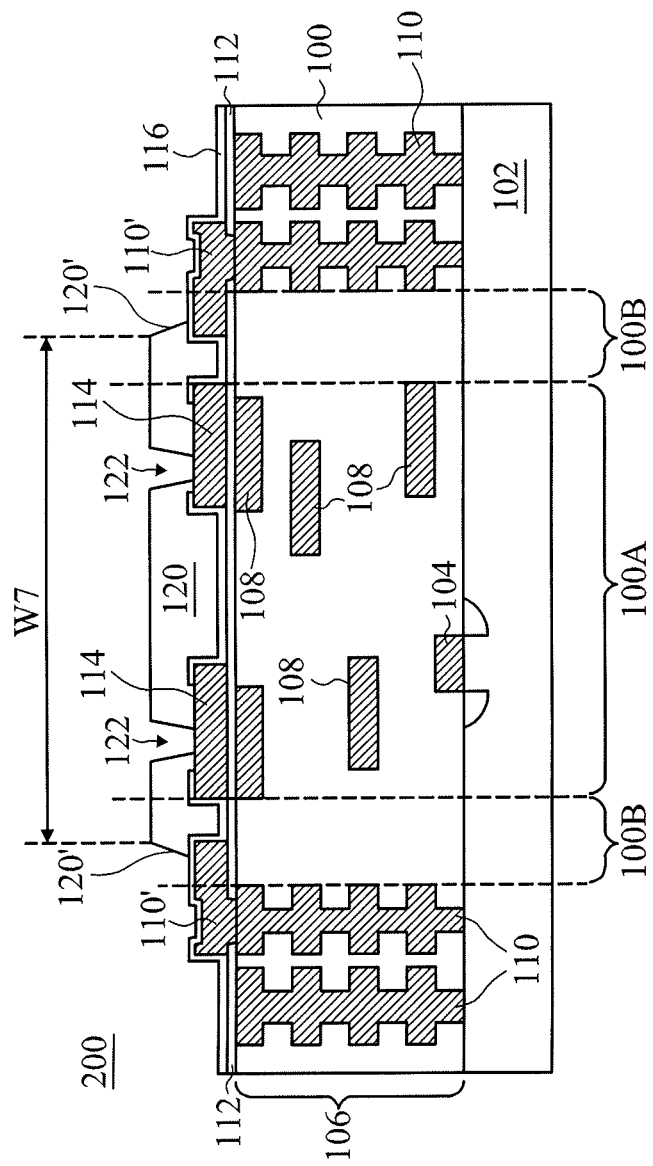

Subsequently, in FIG. 5, openings 122 may be patterned in polymer layer 120 using any suitable process. For example, in an embodiment, polymer layer 120 comprises a photosensitive material and polymer layer 120 is patterned using a photolithography process. In such embodiments, portions of polymer layer 120 may be exposed using a photo mask (not shown). Polymer layer 120 may then be developed, and exposed or unexposed portions of polymer layer 120 may be removed depending on whether a positive or negative resist is used. In other embodiments, polymer layer 120 may be patterned using a different process, such as laser etching or any other suitable process. Openings 122 may extend trough polymer layer 120 to expose conductive features 114.

After patterning, a curing process may be applied to polymer layer 120 to solidify the pattern and harden polymer layer 120. The curing process may include increasing the temperature of patterned polymer layer 120 from room temperature (e.g., about 20° Celsius (C)) to a suitable curing temperature (e.g., between about 200° C. and about 250° C.). The temperature of polymer layer 120 may be maintained at the curing temperature for about two hours in an embodiment. As a result of the curing process, polymer layer 120 may experience shrinkage (not explicitly illustrated). For example, a total lateral dimension W7 of polymer layer 120 may be decreased by about 2 µm after the curing process. Because edges of polymer layer 120 is disposed directly over seal ring portions 110', seal ring 110 may at least partially absorb the stress caused by this shrinkage, which may advantageously decrease the risk of delamination or other manufacturing defects to package 200.

Figure 6:
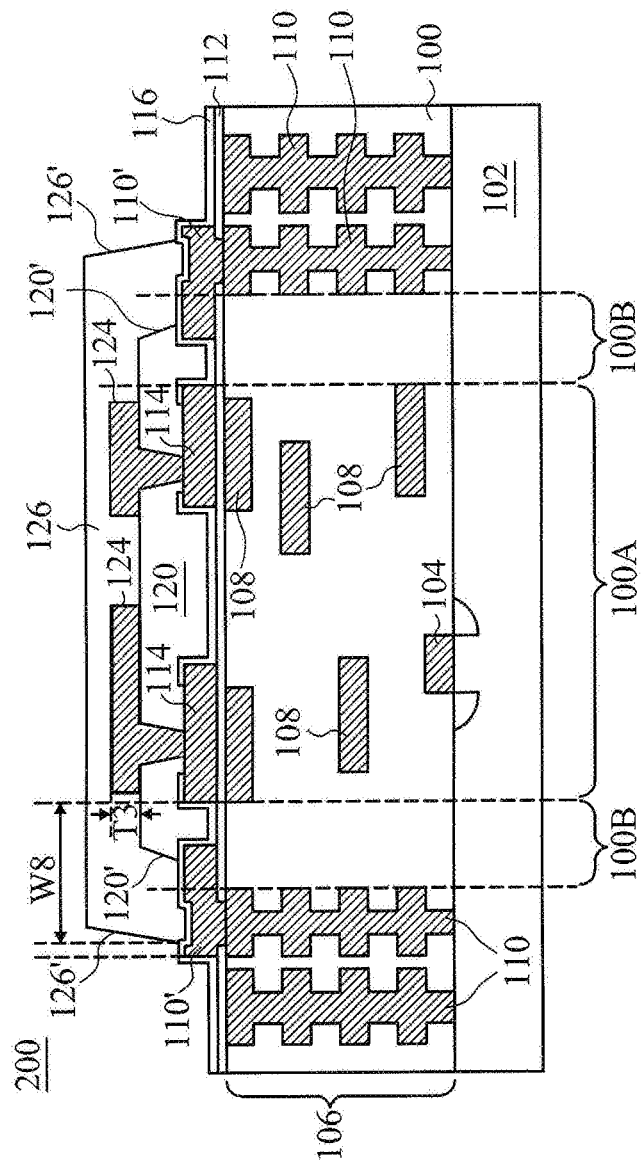

FIG. 6 illustrates the formation of conductive features 124 over polymer layer 120. Conductive features 124 may extend through polymer layer 120 and electrically connect to underlying conductive features 114. In some embodiments, conductive features 124 may be formed using similar materials and/or process(es) as described above with respect to conductive feature 114. The material of conductive features 124 and 114 or may not be the same. For example, in an embodiment, conductive features 124 may comprise copper while conductive features 114 may comprise aluminum. Conductive features 124 may be utilized as RDLs to allow the subsequently formed external connectors (e.g., connectors 130, see FIG. 7) to be placed in any desired location over the semiconductor die 100, instead of limiting the location of the external connectors to the region directly over conductive features 114.

As further illustrated by FIG. 6, an additional polymer layer 126 may be formed over polymer layer 120 and conductive features 124 to protect various underlying features. Polymer layer 126 may be formed using similar materials and/or process(es) as described above with respect to polymer layer 120. Polymer layer 126 may have a thickness T3 of, for example, about 4 µm to about 7 µm although other embodiments may include a polymer layer having a different thickness.

In some embodiments, polymer layer 126 may extend laterally past edges 120' of polymer layer 120. For example, polymer layer 126 may extend beyond edges of functional circuit region 100A by a lateral dimension W8. Lateral dimension W8 may be about 9 µm in embodiments where lateral dimension W6 of polymer layer 120 is about 3.24 µm to about 5.86 µm. Edges 126' of polymer layer 126 are not aligned with edges 120' of polymer layer 120. By configuring edges of polymer layers 120 and 126 to be misaligned, various advantages can be achieved such as improved process control, easier defect identification, and the like. In other embodiments, respective edges 120' and 126' of polymer layers 120 and 126 may be substantially aligned.

Figure 7:
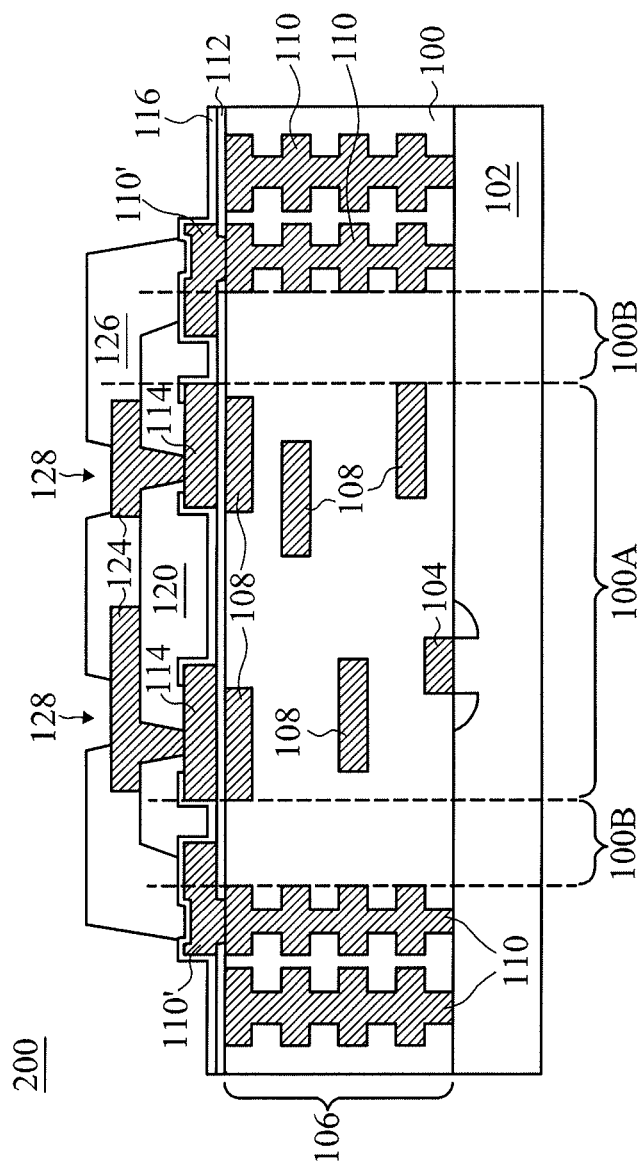

In FIG. 7, polymer layer 126 may be patterned to expose conductive features 124 using any suitable process. For example, in an embodiment, polymer layer 126 comprises a photosensitive material and is patterned using a photolithography process as described above. After patterning, polymer layer 126 may be cured as described above to harden polymer layer 126. Other suitable methods of patterning polymer layer 126 (e.g., etching) may also be used.

Figure 8:
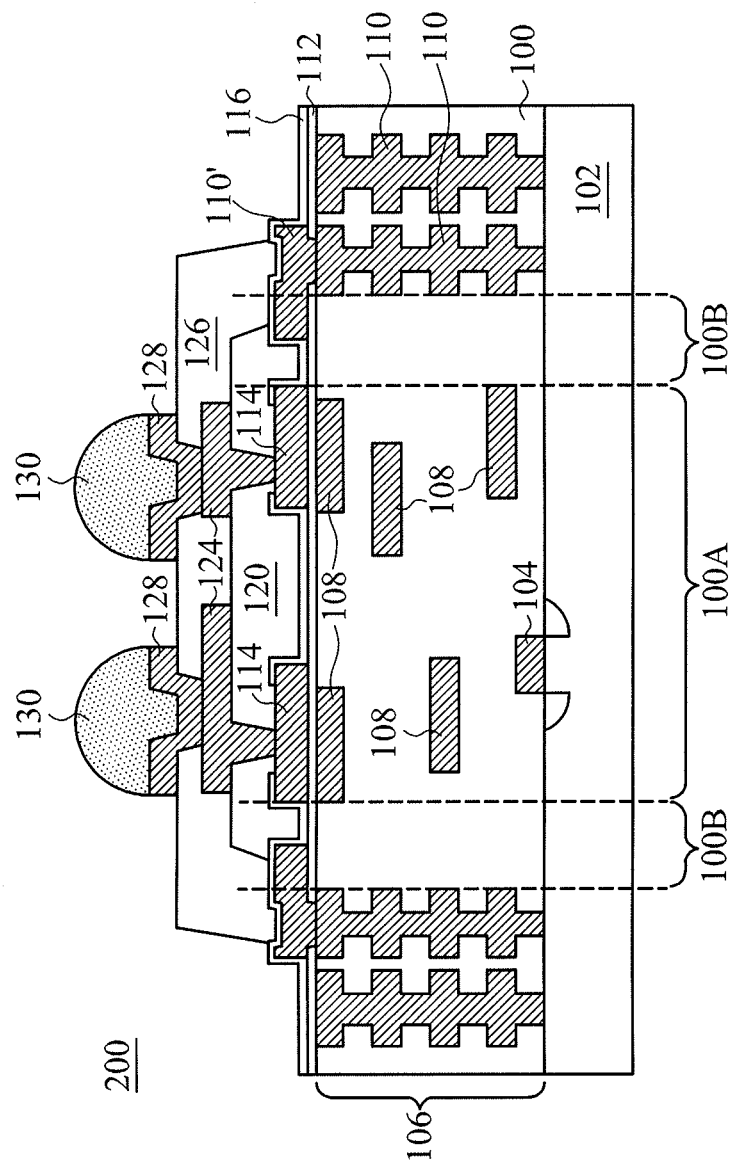

Next in FIG. 8, under bump metallizations (UBMs) 128 and external connectors 130 are formed over die 100. UBMs 128 may be formed in electrical contact with underlying conductive features 124. UBMs 128 may, for example, comprise three layers of conductive materials, such as a layer of titanium, a layer of copper, and a layer of nickel. However, other arrangements of materials and layers, such as an arrangement of chrome/chrome-copper alloy/copper/gold, an arrangement of titanium/titanium tungsten/copper, an arrangement of copper/nickel/gold, or the like are also suitable for the formation of UBMs 128.

UBMs 128 may be created by forming each layer over polymer layer 126 and along the interior of the opening through polymer layer 126. The forming of each layer may be performed using a plating process, such as electrochemical plating, although other processes of formation, such as sputtering, evaporation, or PECVD process, may alternatively be used depending upon the desired materials. Once the desired layers have been formed, portions of the layers may then be removed through a suitable photolithographic masking and etching process to remove the undesired material and to leave UBMs 128 in a desired shape, such as a circular, octagonal, square, or rectangular shape, although any desired shape may alternatively be formed.

External connectors 130 may be a contact bump and may comprise a material such as tin, or other suitable materials, such as silver, lead-free tin, or copper. In an embodiment in which connectors 130 is a tin solder bump, connectors 130 may be formed by initially forming a layer of tin through a suitable method such as evaporation, electroplating, printing, solder transfer, ball placement, and the like. Once a layer of tin has been formed on the structure, a reflow may be performed in order to shape the material into the desired bump shape. External connectors 130 may be used to electrically connect package 200 to another package component, such as another device die, interposers, package substrates, printed circuit boards, a mother board, and the like. Additionally, one or more other features (e.g., SMTs, not illustrated) may also be mounted on package 200. During mounting, stress to package 200 may be reduced to the extension of seal ring 110 into buffer zone 100B and the configuration of polymer layer 120 (e.g., having an edge directly over seal ring 110).

Figure 9:
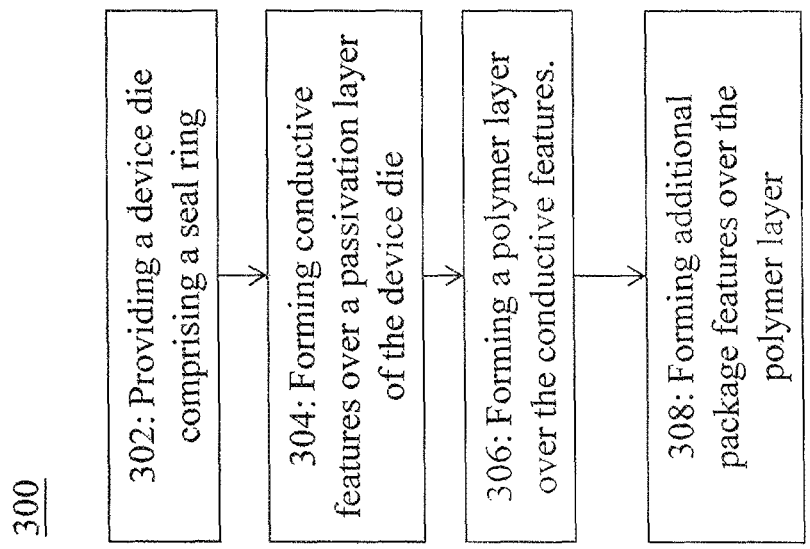
FIG. 9 illustrates a process flow for manufacturing a semiconductor device in accordance with some embodiments.

FIG. 9 illustrates a process flow 300 for forming a device package according to some embodiments. In step 302, a device die (e.g., die 100) is provided, the device die may include a functional circuit region (e.g., region 100A) and a seal ring (e.g., seal ring 110) encircling the functional circuit region. The seal ring may be spaced apart from the functional circuit region by a buffer zone (e.g., buffer region 100B). In step 304, conductive features are formed over a passivation layer in the device die. The conductive features may include a seal ring portion (e.g., portion 110') that extends laterally into the buffer zone. In step 306, a polymer layer (e.g., polymer layer 120) is formed over the conductive features. Edges (e.g., edges 120') of the polymer layer may be disposed directly over of the seal ring, and the polymer layer may extend laterally past edges of the functional circuit region of the device die. In step 308, additional package features, such as, additional polymer layers, conductive features, UBMs, external connectors, and the like may be formed over the polymer layer.

Embodiments include a semiconductor device package having a device die and a seal ring encircling a functional circuit region of the device die. A buffer zone may be formed between the seal ring and the functional circuit region of the device die. The buffer zone may be employed in order to prevent (or at least reduce) damage to the functional components within the circuit region of the device die. In various embodiments, at least a portion of the seal ring disposed above a passivation layer of the die may further extend laterally into the buffer zone, and edges of a polymer layer formed over the seal ring may be disposed directly over the seal ring in the buffer zone. Thus, the seal ring may be used as a landing pad for the polymer layer, which advantageously absorbs stress in the resulting package during subsequent manufacturing processes and reduces manufacturing defects (e.g., delamination).

In accordance with an embodiment, a device includes a semiconductor substrate and an interconnect structure over the semiconductor substrate. The interconnect structure includes a functional circuit region and a first portion of a seal ring spaced apart from the functional circuit region by a buffer zone. The device also includes a passivation layer over the interconnect structure and a second portion of the seal ring over the passivation layer and connected the first portion of the seal ring. The second portion of the seal ring is disposed in the buffer zone In accordance with another embodiment, a device includes a substrate, an interconnect structure including first conductive features electrically connected to active devices formed at a top surface of the substrate and a first passivation layer over the interconnect structure. The device further includes a seal ring having a first portion in the interconnect structure and a second portion connected to the first portion and extending over the first passivation layer. The first portion encircles and is spaced apart from the first conductive features by a buffer zone, and the second portion extends into the buffer zone. The device also includes second conductive features over the first passivation layer and electrically connected to the first conductive features. Top surfaces of the second conductive features and the second portion of the seal ring are substantially level. The device also includes a first polymer layer over the seal ring and the second conductive features. A sidewall of the first polymer layer is disposed directly over the second portion of the seal ring in the buffer zone.

In accordance with yet another embodiment, a method includes forming a first portion of a seal ring around first conductive features in an interconnect structure of a device die, depositing a first passivation layer over the interconnect structure, forming a second conductive feature over the first passivation layer and electrically connected to at least one of the first conductive features, and forming a second portion of the seal ring over the first passivation layer. The first portion of the seal ring is separated from the first conductive features by a buffer zone, and the second portion of the seal ring is electrically connected to the first portion of the seal ring and extends into the buffer zone. The method also includes depositing a second passivation layer over and extending along sidewalls of the second conductive features and the second portion of the seal ring and depositing a first polymer layer over the second passivation layer. The first polymer layer extends into the buffer zone and includes a sidewall disposed directly over the second portion of the seal ring.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a semiconductor substrate;
   an interconnect structure over the semiconductor substrate, wherein the interconnect structure comprises:
      a functional circuit region; and
      a first portion of a seal ring spaced apart from the functional circuit region by a buffer zone, wherein the first portion of the seal ring continuously encircles the functional circuit region in a top-down view of the device, wherein the seal ring is electrically isolated from active devices at a top surface of the semiconductor substrate;
   a passivation layer over the interconnect structure; and
   a second portion of the seal ring over the passivation layer and connected to the first portion of the seal ring, wherein the second portion of the seal ring is disposed in the buffer zone.

2. The device of claim 1 further comprising a polymer layer over the passivation layer, wherein an edge of the polymer layer is disposed directly over the second portion of the seal ring in the buffer zone.

3. The device of claim 2 further comprising an additional polymer layer over the polymer layer, wherein the additional polymer layer extends laterally past edges of the polymer layer.

4. The device of claim 1, wherein the functional circuit region comprises first conductive features electrically connected to active devices at a top surface of the semiconductor substrate, wherein the device further comprises second conductive features directly over the functional circuit region and electrically connected to the first conductive features, and wherein the second conductive features are substantially level with the second portion of the seal ring.

5. The device of claim 1, further comprising a third portion of the seal ring spaced apart from the functional circuit region by the buffer zone, wherein the third portion of the seal ring connects the second portion of the seal ring to the first portion of the seal ring, and wherein top surfaces of the third portion of the seal ring and the second portion of the seal ring are substantially level.

6. The device of claim 5, wherein a lateral dimension of the second portion of the seal ring is at least about 10% of a lateral dimension of the third portion of the seal ring.

7. The device of claim 1, wherein a lateral dimension of the second portion of the seal ring is about 1 µm or greater.

8. The device of claim 1, wherein the buffer zone is free of any conductive features between the semiconductor substrate and the passivation layer, and wherein the second portion of the seal ring does not extend directly over any conductive features.

9. A device comprising:
   a substrate;
   an interconnect structure comprising first conductive features electrically connected to active devices at a top surface of the substrate;
   a first passivation layer over the interconnect structure;
   a seal ring comprising:
      a first portion in the interconnect structure, wherein the first portion is spaced apart from the first conductive features by a buffer zone, and wherein the first portion completely encircles the first conductive features in a top-down view of the device; and
      a second portion connected to the first portion and extending over the first passivation layer, wherein the second portion extends into the buffer zone, wherein a first sidewall of the second portion of the seal ring is disposed directly over the first portion of the seal ring, and wherein a second sidewall of the second portion of the seal ring is disposed in the buffer zone;
   second conductive features over the first passivation layer and electrically connected to the first conductive features, wherein top surfaces of the second conductive features and the second portion of the seal ring are substantially level; and
   a first polymer layer over the second conductive features, wherein a sidewall of the first polymer layer is disposed directly over the second portion of the seal ring in the buffer zone.

10. The device of claim 9, wherein the second portion of the seal ring encircles the second conductive features.

11. The device of claim 9 further comprising a second passivation layer over and extending along sidewalls of the second portion of the seal ring and the second conductive features, wherein the second passivation layer is disposed under the first polymer layer.

12. The device of claim 9 further comprising:
   a second polymer layer over the first polymer layer;
   third conductive features over the second polymer layer and electrically connected to the second conductive features;
   under bump metallizations (UBMs) over and electrically connected to the third conductive features; and
   external connectors over and electrically connected to the UBMs.

13. The device of claim 12, wherein the second polymer layer extends past the sidewall of the first polymer layer.

14. The device of claim 9, wherein the seal ring extends through the interconnect structure.

15. The device of claim 9, wherein the first sidewall of the second portion of the seal ring is disposed outside of the buffer zone.

16. A device comprising:
- an interconnect structure comprising:
  - first conductive features electrically connected to active devices at a top surface of a semiconductor substrate; and
  - a second conductive feature encircling the first conductive features and electrically isolated from any active devices at the top surface of the semiconductor substrate;
- a passivation layer over the interconnect structure;
- a third conductive feature over and extending through the passivation layer, wherein a first line perpendicular to a major surface of the semiconductor substrate extends through the third conductive feature and the second conductive feature, and wherein a second line perpendicular to the major surface of the semiconductor substrate also extends through the third conductive feature and further extends between the first conductive feature and the second conductive feature;
- a fourth conductive feature in a same layer as the third conductive feature, wherein the fourth conductive feature is electrically connected to one or more of the first conductive features; and
- a first polymer layer over the passivation layer, wherein a sidewall of the first polymer layer is disposed directly over the third conductive feature.

17. The device of claim 16 further comprising a second polymer layer over the first polymer layer, wherein the second polymer layer extends along the sidewall of the first polymer layer, and wherein a sidewall of the second polymer layer is disposed directly over the third conductive feature.

18. The device of claim 16 further comprising a fifth conductive feature over and extending through the first polymer layer, wherein the fifth conductive feature is electrically connected to the fourth conductive feature.

19. The device of claim 16, wherein the passivation layer applies stress to the device in a first direction, and wherein the first polymer layer applies stress to the device in a second direction opposite the first direction.

20. The device of claim 16, wherein the first conductive features are spaced apart from the second conductive feature by a buffer zone, and wherein the buffer zone is free of any conductive features between the semiconductor substrate and the passivation layer.

* * * * *